United States Patent [19]
Urushidani et al.

[11] Patent Number: 5,750,434
[45] Date of Patent: May 12, 1998

[54] SURFACE POLISHING OF SILICON CARBIDE ELECTRONIC DEVICE SUBSTRATE USING CEO₂

[75] Inventors: Tatsuo Urushidani, Yokosuka; Shinji Ogino, Kamakura, both of Japan

[73] Assignee: Fuji Electric Co. Ltd., Japan

[21] Appl. No.: 423,841

[22] Filed: Apr. 18, 1995

Related U.S. Application Data

[62] Division of Ser. No. 214,637, Mar. 18, 1994, abandoned.

[30] Foreign Application Priority Data

Mar. 22, 1993 [JP] Japan ................................. 5-86681
May 20, 1993 [JP] Japan ................................ 5-141343

[51] Int. Cl.⁶ .................................................. H01L 21/306
[52] U.S. Cl. .......................... 438/478; 438/492; 438/690; 438/931; 438/959; 438/974
[58] Field of Search .......................... 156/645.1; 437/77, 437/175, 100, 904; 438/690, 931, 959, 974, 478, 492; 148/DIG. 148

[56] References Cited

U.S. PATENT DOCUMENTS

| | | | |
|---|---|---|---|
| 4,875,083 | 10/1989 | Palmour | 357/23.6 |
| 4,912,063 | 3/1990 | Davis et al. | 437/100 |
| 4,994,139 | 2/1991 | Biermann et al. | 156/630 |
| 5,011,549 | 4/1991 | Kong et al. | 148/33.1 |
| 5,032,203 | 7/1991 | Doy et al. | 156/345 |
| 5,061,972 | 10/1991 | Edmond | 357/13 |
| 5,248,385 | 9/1993 | Powell | 117/951 |
| 5,270,252 | 12/1993 | Papanicolaou | 437/175 |
| 5,272,107 | 12/1993 | Suzuki et al. | 437/100 |
| 5,319,220 | 6/1994 | Suzuki et al. | 437/100 |
| 5,363,800 | 11/1994 | Larkin et al. | 117/951 |

FOREIGN PATENT DOCUMENTS 1956011  4/1971  Germany.

OTHER PUBLICATIONS

Suzuki et al., "C-V Characteristics of SiC Metal-Oxide-Semiconductor Diode with a Thermally Grown SiO₂ Layer", Appl. Phys. Lett. 39(1), 1 Jul. 1981, p. 89.

"Step-Controlled VPE Growth of SiC Single Crystals at Low Temperatures", Kuroda, Naotaka et al., Extended Abstracts of the 19th Conference on Solid State Devices and Materials, Tokyo 1987, pp. 227-230.

"Mechanochemical Polishing of Single-Crystal Silicon Carbide", Kikuchi, Masao et al., The Corrected Papers for the 1990 Autumn Scientific Lecture Meeting; pp. 327-328.

M. Kikuchi et al. "Mechanochemical Polishing of Silicon Carbide Single Crystal with Chromium (III) Oxide Abrasive." Journal of the American Ceramics Society, 75(1), (1992) pp. 189-194.

*Primary Examiner*—Charles L. Bowers, Jr.
*Assistant Examiner*—Matthew Whipple
*Attorney, Agent, or Firm*—Rossi & Associates

[57] ABSTRACT

A silicon carbide substrate is dry-polished using chromium oxide $Cr_2O_3$, ion oxide $Fe_2O_3$, or cerium oxide $CeO_2$ to obtain a good polished surface free of mechanical defects and with less crystal distortion. Films are then formed on the surface to create an improved electronic device.

6 Claims, 3 Drawing Sheets

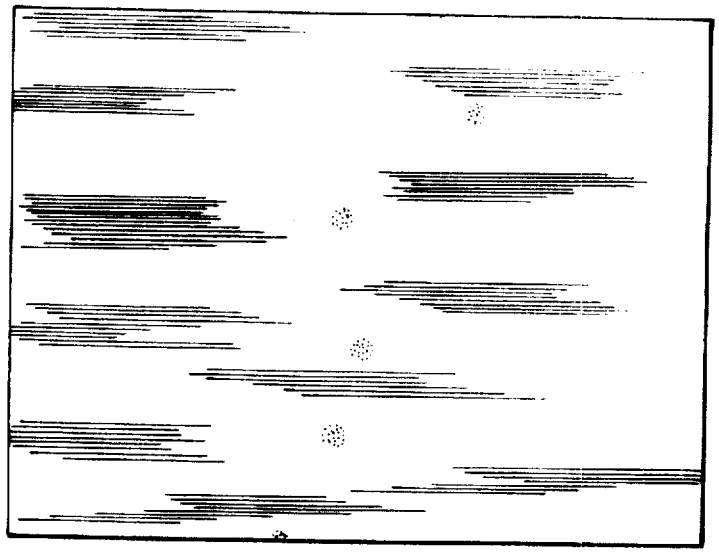
FIG. 3  ←—→ 50μm
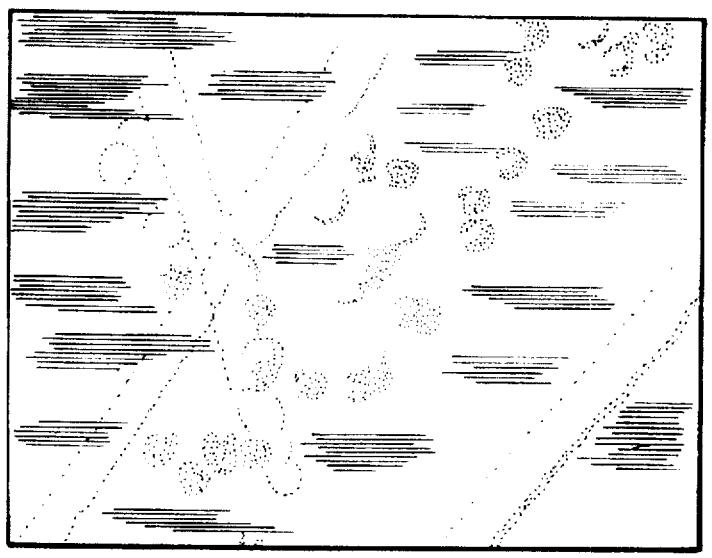
FIG. 4  ←—→ 50μm

SURFACE POLISHING OF SILICON CARBIDE ELECTRONIC DEVICE SUBSTRATE USING CEO₂

This is a Division of application Ser. No. 08/214,637 filed Mar. 18, 1994, abandoned.

FIELD OF THE INVENTION

The present invention relates to an electronic device and, in particular, to a method of surface polishing of a silicon carbide substrate used in an electronic device.

BACKGROUND OF THE INVENTION

There have been recent attempts to improve the high-frequency and high power performance of silicon-based power devices. The level of performance of such devices, however, is approaching its limit. In addition, power devices are often used in conditions where high temperatures or radiation is present. Silicon devices, however, cannot be used under such conditions. New material must therefore be utilized to provide electronic devices with higher performance.

Since silicon carbide has a wide prohibited band (6H type: 2.93 eV), it can control electric conductivity well and provide high radiation-resistance at high temperatures. Silicon carbide has a dielectric breakdown electric field that is one order of magnitude more than of silicon, which makes it possible to utilize silicon carbide to high voltage-proof devices. In addition, its electron saturation drift velocity, which is twice that of silicon, makes it possible to utilize silicon carbide to high-frequency high power control.

In order to utilize the good material characteristics of silicon carbide in power devices, a substrate of silicon carbide is epitaxially formed and a metal or an oxide film is formed on the substrate to make an electronic device after the surface of a silicon carbide substrate has been finished sufficiently to make it a mirror surface. However, since the silicon carbide substrate has a hardness of nine, it is chemically stable, and is not affected by acid or alkali, diamond grindstones must be used to polish the silicon carbide substrate. Such polishing causes fine flaws or cracks to be created or causes the crystal structure on the surface of the silicon carbide substrate to be disturbed. Such defects must be removed by means of etching. Although etching eliminates the disturbance of the crystal structure, however, it does not remove flaws or cracks. In fact, the number of such defects are increased by etching. If an oxide or a metal film is formed on the silicon carbide substrate, electric fields concentrate on the defective parts (such as flaws or cracks) created by polishing, and cause the characteristics of the electronic device to deteriorate.

Given the above realities, it is an object of the invention to provide a good silicon carbide electronic device by providing a silicon carbide substrate with a smooth surface and a crystal structure free of disturbances.

SUMMARY OF THE INVENTION

The above object is achieved by providing an electronic device that uses a silicon carbide substrate which has a silicon carbide substrate and a film formed thereon, wherein the silicon carbide substrate has its surface dry-polished by a polishing means made up of at least one of the following: chromium oxide $Cr_2O_3$, cerium oxide $CeO_2$, and iron oxide $Fe_2O_3$. The film is formed on the dry-polished surface of the silicon carbide substrate.

Polishing with chromium oxide $Cr_2O_3$, cerium oxide $CeO_2$ or iron oxide $Fe_2O_3$ provides a good polished surface due to the mechanochemical effects of these substances. Because of these mechanochemical effects, frictional heat generated during polishing and the catalysis of these oxides cause silicon carbide to oxidize because of the oxygen in the air, thereafter being mechanically released. As a result, the surface of the silicon carbide substrate is polished, being free of mechanical defects or crystal distortion.

BRIEF DESCRIPTION OF THE DRAWINGS

The invention will now be described in greater detail with reference to the accompanying drawings, wherein:

FIG. 3 is a photograph showing the grain structure of the polished surface of a silicon carbide substrate in accordance with the invention;

FIG. 4 is a photograph showing the grain structure of the polished surface of the silicon carbide substrate of a conventional electronic device;

DETAILED DESCRIPTION OF THE PREFERRED EMBODIMENTS

Figure 1:
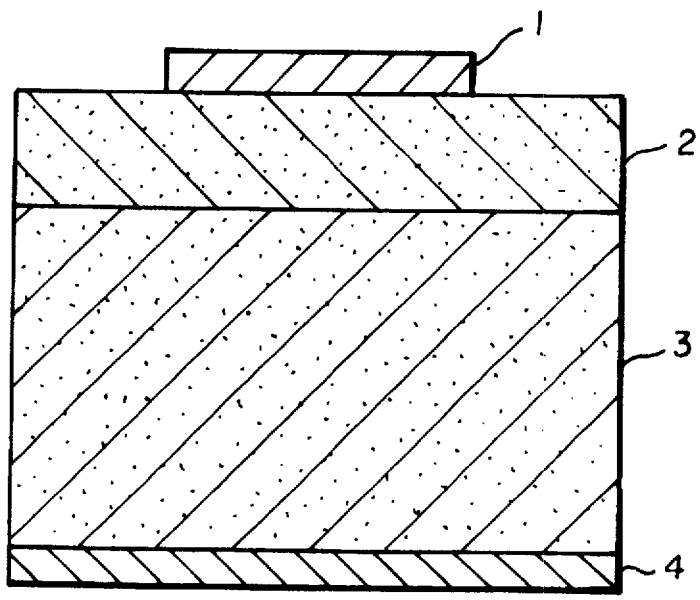
FIG. 1 is a sectional view of a first electronic device made in accordance with the invention.

A first electronic device formed in accordance with the invention is described below with reference to the drawings. FIG. 1 is a sectional view of an electronic device according to this invention. The electronic device is a Schottky diode. The Schottky diode is manufactured by polishing a silicon carbide substrate 3, forming a silicon carbide epitaxial film 2 on the substrate 3, forming a nickel electrode 4 on the other main surface of the silicon carbide substrate 3, and forming a gold electrode 1, e.g. a Schottky electrode, on the silicon carbide epitaxial film 2.

The polishing of the silicon carbide substrate 3 will now be explained in detail. A polishing plate with chromium oxide $Cr_2O_3$ abrasive grains measuring 1 µm distributed in phenol resin is rotated at 100 rpm to polish a specified surface of the substrate 3 (for example a n-type 6H-silicon carbide SiC substrate) while the substrate 3 is inclined at an angle of 5° in a specified direction. Table 1 shows the specified surface and direction:

TABLE 1

| Specified Surface | Specified Direction |
|---|---|
| (0001) | <11$\bar{2}$0> |

For the sake of comparison, after polishing with silicon carbide SiC abrasive grains measuring 150 µm, silicon carbide substrates were polished with diamond abrasive grains measuring 30 µm, 3 µm, and 1 µm. Finally, these substrates were buffed with diamond grains measuring 1 µm. Moreover, the substrates were simultaneously etched in a mixed gas made up of hydrogen gas with a flow of 2 slm and hydrogen chloride HCl gas with a flow of 3 sccm at 1200° C. for 5 minutes. After that, they were observed using a Nomarski microscope. No flaws were found on the surfaces polished with chromium oxide $Cr_2O_3$ (see FIG. 3), whereas the surfaces polished with diamond abrasive grains of various sizes eventually took on a mirror-surface finish, although groove-like polishing flaws created by the etching process were found (see FIG. 4). In other words, fine flaws that had not been detected by the Nomarski microscope became larger after etching with hydrogen chloride HCl. However, no groove-like etched parts and few flaws were found on the surfaces polished with chromium oxide $Cr_2O_3$ and etched with HCl. Many hexagonal etching pits in the figure were created because of transition and were not caused by polishing.

An n-type epitaxial film with a carrier density of $2 \times 10^{15}$ $cm^{-3}$ and a thickness of 9 μm was formed on a silicon carbide Sic substrate (n-type: carrier density: $1 \times 10^{18}$ $cm^{-3}$) polished by using the above two methods. As described above, a mixed gas including hydrogen $H_2$ gas with a flow of 2 slm and hydrogen chloride HCl gas with a flow of 3 sccm at 1200° C. was introduced to etch the surface. Then, a mixed gas made up of hydrogen $H_2$ gas with a flow of 3 slm, silane $SiH_4$ gas with a flow of 3 sccm, and propane gas with a flow of 2.5 sccm at 1500° C. for 4 hours was introduced to form the n-type 6H-silicon carbide Sic epitaxial film 2. The epitaxially formed film had surface conditions similar to the surface conditions present after etching, shown in the previous figure, and the epitaxial film formed on the substrate polished with chromium oxide $Cr_2O_3$ had fewer flaws and a smoother surface than the film formed epitaxially on the substrate polished with diamond grains.

Ni was vacuum-evaporated on the back surface of the n-type 6H-silicon carbide Sic substrate 3, which was then heated at 1200° C. in an Ar atmosphere for 10 minutes to obtain an ohmic nickel electrode 4. Au was then vacuum-evaporated on the n-type 6H-silicon carbide Sic epitaxial film 2 to obtain a gold electrode 1, that is, a Schottky electrode.

Figure 6:
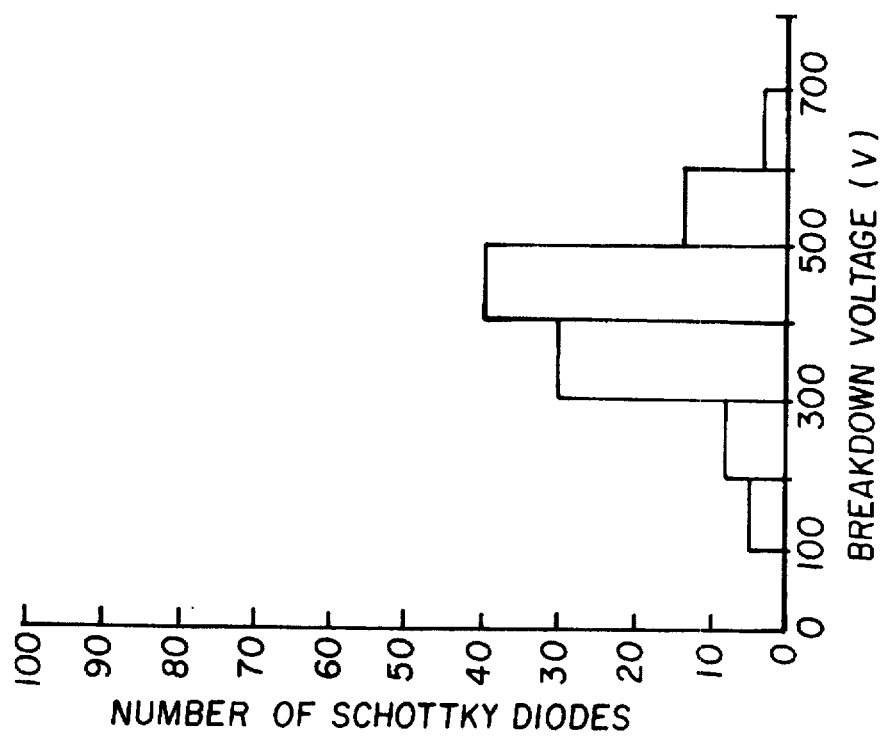
FIG. 6 is a histogram illustrating the distribution of the breakdown voltage of one hundred electronic devices formed on a SiC substrate prepared by a conventional method.
Figure 5:
FIG. 5 is a histogram illustrating the distribution of the breakdown voltage of one hundred electronic devices formed on a SiC substrate prepared in accordance with the invention.

FIG. 5 is a diagram illustrating the distribution of the breakdown voltages for one hundred electronic devices formed on a substrate prepared in accordance with the invention, while FIG. 6 is a diagram illustrating the distribution of the breakdown voltages of one hundred electronic devices formed on a substrate prepared by conventional methods. As can be seen from the figures, the electronic device according to the invention has a breakdown voltage higher than that of a conventional electronic device. This characteristic is also observed when either cerium oxide $CeO_2$ or iron oxide $Fe_2O_3$ is used instead of chromium oxide $Cr_2O_3$.

Figure 2:
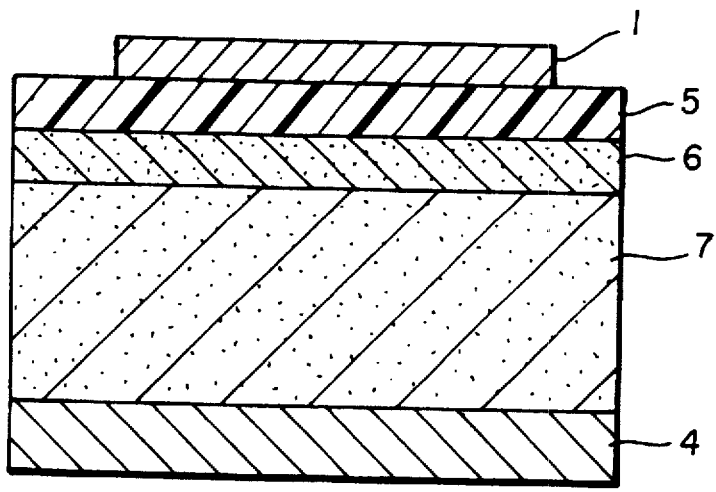
FIG. 2 is a sectional view of the important part of another electronic device made in accordance with the invention.

FIG. 2 is a sectional view of the important part of an electronic device according to a different embodiment of the invention. The illustrated device is a MOS diode. An n-type silicon carbide SiC epitaxial film 6 is laminated on a n-type silicon carbide substrate 7, and a silica $SiO_2$ insulation layer 5 is formed on the epitaxial film 6.

The invention provides an electronic device that uses a silicon carbide substrate which has a silicon carbide substrate and a film formed thereon. The silicon carbide substrate has its surface dry-polished using a polishing means including at least one of the following: chromium oxide $Cr_2O_3$, cerium oxide $CeO_2$, and iron oxide $Fe_2O_3$. The film is then formed on the silicon carbide substrate. As a result, the mechanochemical polishing effect of chromium oxide $Cr_2O_3$, cerium oxide $CeO_2$, or iron oxide $Fe_2O_3$ provides a good polished surface free of mechanical defects or crystal distortion, and an epitaxial film can be laminated on the polished surface to manufacture a good silicon carbide electronic device.

We claim:

1. A method of forming an electronic device comprising the steps of: dry-polishing a surface of a silicon carbide substrate with a polishing means consisting essentially of cerium oxide $CeO_2$; and forming a silicon carbide epitaxial film on a front surface of the silicon carbide substrate.

2. A method of forming an electronic device as claimed in claim 1, further comprising the steps of forming a first metal film electrode on the silicon carbide epitaxial film and forming a second metal film electrode on a back surface of silicon carbide substrate.

3. A method of forming an electronic device as claimed in claim 1, further comprising the steps of forming an insulation layer on the silicon carbide epitaxial film, forming a first metal film electrode on the insulation layer, and forming a second metal film electrode on a back surface of the silicon carbide substrate.

4. A method of forming an electronic device as claimed in claim 1, wherein a breakdown voltage of the electronic device is not less than 400 volts.

5. A method of forming an electronic device as claimed in claim 2, wherein a breakdown voltage of the electronic device is not less than 400 volts.

6. A method of forming an electronic device as claimed in claim 3, wherein a breakdown voltage of the electronic device is not less than 400 volts.

* * * * *